United States Patent [19]

Vasile

[11] Patent Number: 5,157,289
[45] Date of Patent: Oct. 20, 1992

[54] FET ADAPTIVE LIMITER WITH HIGH CURRENT FET DETECTOR

[75] Inventor: Carmine F. Vasile, Patchoque, N.Y.

[73] Assignee: Grumman Aerospace Corporation, Bethpage, N.Y.

[21] Appl. No.: 737,163

[22] Filed: Jul. 29, 1991

[51] Int. Cl.⁵ .............................................. H04B 1/10
[52] U.S. Cl. ...................................... 307/542; 307/264; 307/540; 307/550; 307/556; 307/520; 307/296.5
[58] Field of Search ............... 307/264, 540, 542, 520, 307/549, 550, 556, 568, 296.4, 296.5

[56] References Cited

U.S. PATENT DOCUMENTS

| | | | |
|---|---|---|---|
| 3,753,159 | 8/1973 | Burwen | 307/520 |
| 3,818,244 | 6/1974 | Dolby et al. | 307/550 |
| 4,210,829 | 7/1980 | Wong et al. | 307/550 |
| 4,517,534 | 3/1985 | Smith | 307/264 |
| 4,599,525 | 7/1986 | Tzeng | 307/586 |
| 4,701,715 | 10/1987 | Amazawa et al. | 307/549 |
| 4,809,020 | 12/1989 | Bird | 307/264 |
| 4,890,021 | 12/1989 | Walker | 307/542 |
| 4,947,063 | 8/1990 | O'Shaughnessy et al. | 307/542 |
| 5,001,374 | 3/1991 | Chang | 307/520 |
| 5,051,625 | 9/1991 | Iked et al. | 307/542 |

*Primary Examiner*—Janice A. Howell
*Assistant Examiner*—Terry D. Cunningham
*Attorney, Agent, or Firm*—Richard G. Geib; Daniel J. Tick

[57] ABSTRACT

An adaptive power limiter circuit for suppressing power spikes output by a receiver to reduce the chances of damage to the receiver includes a first attenuating stage having an input terminal for receiving power spikes of input magnitude. A first FET is coupled to the input terminal and an output terminal is coupled to the first FET for providing power spikes of output magnitude which are diminished in power relative to the input magnitude. A second attenuating stage has an input terminal connected to the output terminal of the first attenuating stage for receiving the power spikes output by the first stage, an additional FET is coupled to the input terminal of the second stage and a second stage output terminal is coupled to the additional FET for providing power spikes of output magnitude which are considerably diminished in power relative to the input magnitude of the spikes at the input terminal of the first stage.

4 Claims, 1 Drawing Sheet

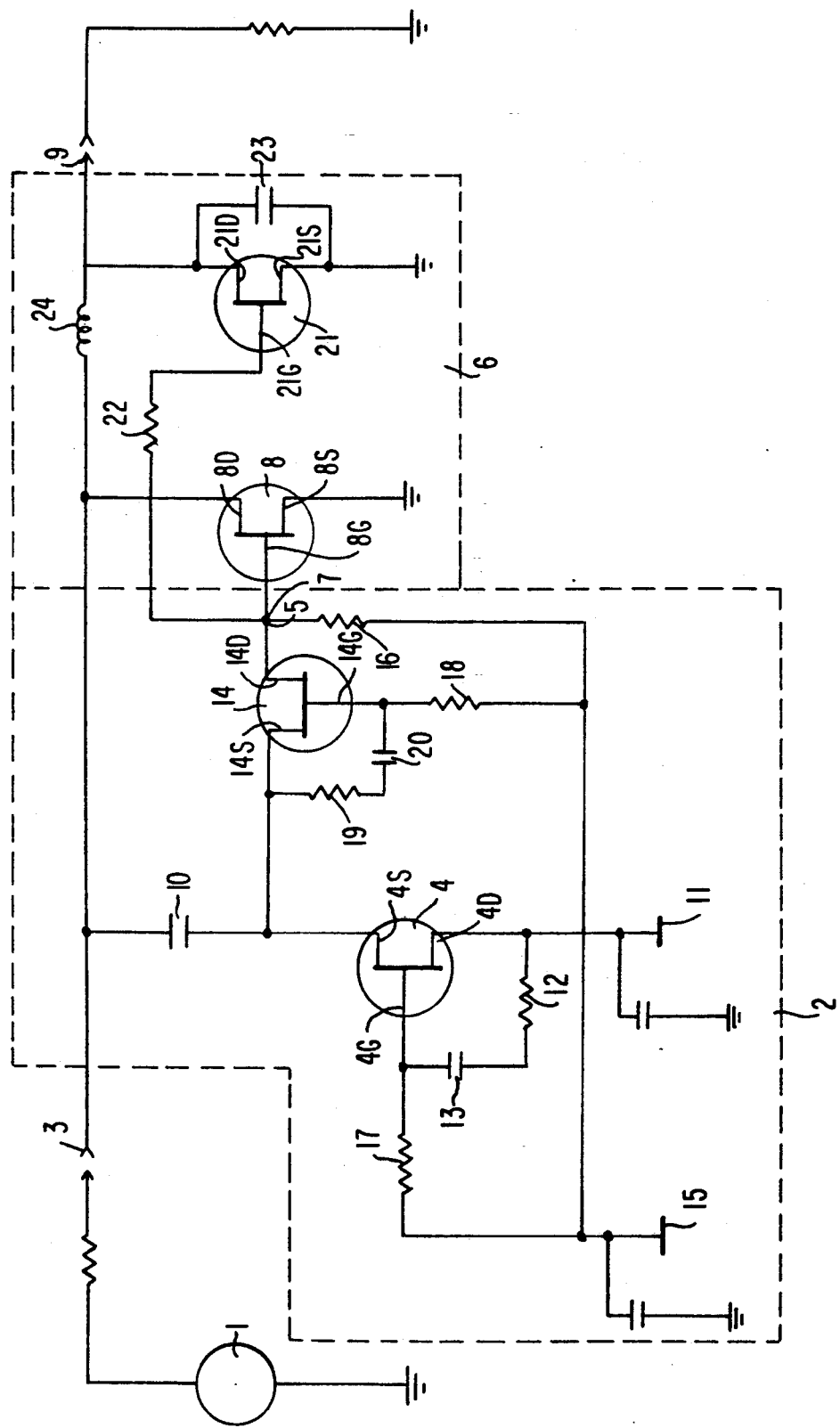

FET ADAPTIVE LIMITER WITH HIGH CURRENT FET DETECTOR

BACKGROUND OF THE INVENTION

The present invention relates to an adaptive power limiter circuit. More particularly, the invention relates to an FET adaptive limiter with high current FET detector.

A field effect transistor (FET) is a three terminal semiconductor amplifier, which may be obtained in two polarities for use with either polarity of supply voltage. An ordinary bipolar transistor uses a current into its base terminal to control a larger current between its emitter and collector.

A FET uses a voltage on the 'gate' (=base) terminal to control the current between its 'source' (=emitter) and 'drain' (=collector). Therefore, a bipolar transistor gain is characterized as a current gain, whereas the FET gain is characterized as a transconductance, or mutual conductance $g_m$, that is, the ratio of change in output (drain) current to input (gate) voltage, usually expressed either in milliamperes per volt (mA/V) or micromhos ($\mu$ mho) where 1000 mho=1 mA/V. The FET also differs from the bipolar transistor in the input gate impedance compared with transistor base impedance. In the transistor, the base input corresponds to a forward-biased diode with an impedance of typically hundreds or thousands of ohms. In the FET the input impedance corresponds to a reverse-biased diode, or an insulator, at tens of megohms upwards. FETs were originally known as "unipolar" transistors, because their action is governed by only one type of internal current carrier, either the hole or the electron, depending on the device polarity. Ordinary transistors were distinguished as "bipolar", because the device currents are conducted by two types of carriers, that is, both electrons and holes, whatever the device polarity.

Junction gate, depletion insulated gate, and enhancement insulated gate FETs work in slightly different ways, although they all depend on the field effect, in which a voltage applied to a gate controls the resistance of a semiconductor channel between the source and the drain.

Monolithic microwave integrated circuit (MMIC) FETs are severely damaged by high power microwave (HPM) pulses electrostatic discharge (ESD) and electromagnetic pulses (EMP).

The principal object of the invention is to provide a an FET adaptive limiter for suppressing power spikes reliably and effectively.

An object of the invention is to provide an FET adaptive limiter of simple structure which efficiently, effectively and reliably suppresses power spikes.

Another object of the invention is to provide an FET adaptive limiter which suppresses power spikes to protect against wideband high power microwaves, electromagnetic pulses (EMP) and electrostatic discharge (ED).

Still another object of the invention is to provide an L band MMIC limiter with an integral peak detector circuit.

Yet another object of the invention is to provide an FET adaptive limiter circuit which provides a 55 dB suppression of a 50 watt CW signal with 0.3 nJoule spike energy.

Another object of the invention is to provide an FET limiter with a subnanosecond attack time.

Still another object of the invention is to provide a power limiter having low insertion loss when in standby mode.

Yet another object of the invention is to provide an FET adaptive limiter which enables its FET to protect the low noise amplifier (LNA) from high energy HPM without degrading its ultrafast spike suppression capability.

Still another object of the invention is to provide an FET adaptive limiter which suppresses power spikes efficiently and effectively and provides extremely rapid recovery, in the range of 25 to 50 ns, and minimizes HPM blinding of a receiver in which it is installed.

Yet another object of the invention is to provide a FET adaptive limiter which reduces, by a factor of at least two, the average power dissipated in the circuit FET and thereby provides continuous protection from high energy signals and/or CW HPM.

BRIEF SUMMARY OF THE INVENTION

In accordance with the invention, an FET adaptive limiter for suppressing power spikes comprises a first attenuating stage having an input terminal for receiving power spikes of input magnitude, a first FET coupled to the input terminal and an output terminal coupled to the first FET for providing power spikes of output magnitude which are diminshed in power relative to the input magnitude. The first FET has a gate, a source and a drain, and the first attenuating stage has a first capacitor coupling the source of the first FET to the input terminal of the first stage. A first voltage source is directly connected to the drain of the first FET. A second capacitor is provided and a first resistor is connected in series with the second capacitor between the drain and the gate of the first FET. A second FET has a gate, a source connected directly to the source of the first FET and a drain connected directly to the output terminal of the first attenuating stage. A second voltage source is provided, a second resistor couples the second voltage source to the drain of the second FET and a third resistor couples the second voltage source to the gate of the first FET. A second attenuating stage has an input terminal connected to the output terminal of the first attenuating stage for receiving the power spikes output by the first stage, an additional FET coupled to the input terminal of the second stage and a second stage output terminal coupled to the additional FET for providing power spikes of output magnitude which are considerably diminished in power relative to the input magnitude of the spikes at the input terminal of the first stage.

The first attenuating stage further comprises a fourth resistor couples the second voltage source to the gate of the second FET. A third capacitor is provided and a fifth resistor is connected in series with the third capacitor between the source and the gate of the second FET.

The additional FET has a gate directly connected to the drain of the second FET, a source and a drain directly connected to the drain of the second FET, directly connected to the gate of the additional FET and directly connected to the input terminal of the first attenuating stage and directly connected to the input terminal of the second attenuating stage.

The second attenuating stage further comprises a fourth FET having a gate, a source and a drain. A sixth resistor couples the gate of the fourth FET to the drain and the gate of the third FET and to the drain of the second FET. A fourth capacitor, the source and the drain of the fourth FET are connected to each other via the fourth capacitor and the source of the fourth FET being connected to a point at ground potential. An inductor couples the drain of the fourth FET to the drain of the third FET. The second stage output terminal is connected directly to the drain of the fourth FET and to the inductor.

BRIEF DESCRIPTION OF THE DRAWINGS

In order that the invention may be readily carried into effect, it will now be described with reference to the accompanying drawing, wherein the single Figure is a schematic circuit diagram of an embodiment of the FET adaptive limiter of the invention.

DETAILED DESCRIPTION OF PREFERRED EMBODIMENT

As shown in the Figure, the FET adaptive limiter of the invention, has a first attenuating stage 2 having an input terminal 3 for receiving power spikes of input magnitude when coupled to a receiver 1. The stage 2 functions as a high current detector using FETs instead of diodes. A first FET 4 is coupled to the input terminal 3. An output terminal 5 is coupled to the first FET 4 for providing power or power spikes of output magnitude which are diminished in power relative to the input magnitude. The FETs utilized in the FET adaptive limiter of the invention are depletion mode FETs.

A second attenuating stage 6 has an input terminal 7 connected to the output terminal 5 of the first attenuating stage 2 for receiving the power spikes output by said first stage. The stage 6 is the second stage of the two stage limiter and functions as a low pass filter section. An additional FET 8 is coupled to the input terminal 7 of the second stage 6. A second stage output terminal 9 is coupled to said additional FET for providing power spikes of output magnitude which are considerably diminished in power relative to the input magnitude of the spikes at the input terminal 3 of the first stage 2.

The first FET 4 has a gate 4G, a source 4S and a drain 4D. The first attenuating stage 2 comprises a first capacitor 10 coupling the source 4S of the first FET 4 to the input terminal 3 of said first stage. A first voltage source 11 of −5 volts is directly connected to the drain 4D of the first FET 4. A first resistor 12, which limits the gate 4G RF current, is connected in series with a second capacitor 13 between the drain 4D and the gate 4G of the first FET 4. The capacitor 13 is a DC Block. A second FET 14 of the first attenuating stage 2 has a gate 14G, a source 14S connected directly to the source 4S of the first FET 4 and a drain 14D connected directly to the output terminal 5 of said first stage. A second voltage source 15 of −9 volts is coupled coupled to the drain 14D of the second FET 14 via a second resistor 16 which functions as a bias resistor.

The first attenuating stage 2 further comprises a third resistor 17, which is also a bias resistor and which couples the second voltage source 15 to the gate 4G of the first FET 4. Each of the gate 4G and drain 4D of the first FET is coupled to ground via an RF bypass capacitor. A fourth resistor 18 couples the second voltage source 15 to the gate 14G of the second FET 14. A fifth resistor 19 is connected in series with a third capacitor 20 between the source 14S and the gate 14G of the second FET 14. The resistor 19 limits the RF current of the gate 14G. The capacitor 20 is a DC block.

The second attenuating stage 6 comprises a third FET which constitutes the additional FET 8 and has a gate 8G, a drain 8D directly connected to the input terminal 3 of the first attenuating stage 2 and a source 8S directly connected to ground. The second FET 14 is part of the voltage doubler-detector circuit of the Figure and the third FET 8 is a large limiter FET whose gate capacitance is part of the voltage doubler terminal 7 of the second attenuating stage. A fourth FET 21 has a gate 21G, a source 21S and a drain 21D.

A sixth resistor 22, which functions as a bias, RC filter, couples the gate 21G of the fourth FET 21 to the gate 8G of the third FET 8 and to the drain 14D of the second FET 14. The fourth FET 21 is a smaller switch FET controlled by the detector voltage and the third and fourth FETs function as the two stage limiter. A fourth capacitor 23 is connected between the source 21S and the drain 21D of the FET 21. The capacitor 23 functions as a frequency of LC filter. An inductor 24, which is a low pass filter inductor couples the drain 21D of the fourth FET to the drain 8D of the third FET 8. The second stage output terminal 9 is connected directly to the drain 21D of the fourth FET 21 and to the inductor 24.

The resistors connect the receiver 1 and the input terminal 3 and the output terminal 9 to ground. These resistors are for simulation purposes.

Although shown and described in what is believed to be the most practical and preferred embodiment, it is apparent that departures from the specific method and design described and shown will suggest themselves to those skilled in the art and may be made without departing from the spirit and scope of the invention. I, therefore, do not wish to restrict myself to the particular construction described and illustrated, but desire to avail myself of all modifications that may fall within the scope of the appended claims.

I claim:

1. An FET adaptive limiter for suppressing power spikes, said limiter comprising
    a first attenuating stage having an input terminal for receiving power spikes of input magnitude, a first FET coupled to said input terminal and an output terminal coupled to said first FET for providing power spikes of output magnitude which are diminished in power relative to said input magnitude, said first FET having a gate, a source and a drain, and said first attenuating stage having a first capacitor coupling the source of said first FET to said input terminal of said first stage, a first voltage source directly connected to the drain of said first FET, a second capacitor, a first resistor connected in series with said second capacitor between said drain and the gate of said first FET, a second voltage source, a second FET having a gate coupled to said second voltage source, a source connected directly to the source of said first FET and a drain connected directly to the output terminal of said first attenuating stage, a second resistor coupling said second voltage source to the drain of said second FET and a third resistor coupling said second voltage source to said gate of said first FET; and
    a second attenuating stage having an input terminal connected to the output terminal of said first attenuating stage for receiving the power spikes output by said first stage, an additional FET connected to said input terminal of said first attenuating stage and coupled to said input terminal of said second stage and a second stage output terminal coupled to said additional FET for providing power spikes of output magnitude which are considerably diminished in power relative to the input magnitude of said spikes at said input terminal of said first stage.

2. An FET adaptive limiter as claimed in claim 1, wherein said first attenuating stage further comprises a fourth resistor coupling said second voltage source to the gate of said second FET and a third capacitor and a fifth resistor connected in series with said third capacitor between said source and said gate of said second FET.

3. An FET adaptive limiter as claimed in claim 1, wherein said additional FET has a gate directly connected to said drain of said second FET, a source directly connected to a node at ground potential and a drain directly connected to said input terminal of said first attenuating stage.

4. An FET adaptive limiter as claimed in claim 3, wherein said second attenuating stage further comprises a fourth FET having a gate, a source and a drain, a sixth resistor coupling the gate of said fourth FET to said drain of said second FET, a fourth capacitor, said source and said drain of said fourth FET being connected to each other via said fourth capacitor and said source of said fourth FET being connected to a point at ground potential and an inductor coupling said drain of said fourth FET to said drain of said additional FET, said second stage output terminal being connected directly to said drain of said fourth FET and to said inductor.

* * * * *